US005395729A

United States Patent [19]

Reardon et al.

[11] Patent Number: 5,395,729

[45] Date of Patent: Mar. 7, 1995

[54] LASER-INDUCED THERMAL TRANSFER PROCESS

[75] Inventors: Joseph E. Reardon, Wilmington, Del.; Anthony J. Serino, Kennett Square, Pa.

[73] Assignee: E. I. du Pont de Nemours and Company, Wilmington, Del.

[21] Appl. No.: 55,496

[22] Filed: Apr. 30, 1993

[51] Int. Cl.[6] .......................... G03F 9/00; G03C 7/00

[52] U.S. Cl. .................................. 430/200; 430/254; 430/952; 430/964

[58] Field of Search ................ 430/200, 964, 952, 254

[56] References Cited

U.S. PATENT DOCUMENTS

| | | | |
|---|---|---|---|
| 3,129,661 | 4/1964 | Newman | 430/200 |
| 3,833,441 | 9/1974 | Heiart | 430/200 |
| 3,962,513 | 6/1976 | Eames | 428/323 |
| 3,964,389 | 6/1976 | Peterson | 101/467 |
| 3,975,563 | 8/1976 | Franer et al. | 430/200 |
| 4,245,003 | 1/1981 | Oransky et al. | 428/323 |
| 4,626,493 | 12/1986 | Butters et al. | 430/201 |
| 4,914,078 | 4/1990 | Hann et al. | 503/227 |
| 5,064,743 | 11/1991 | Koshizuka et al. | 430/253 |
| 5,089,372 | 2/1992 | Kirihata et al. | 430/200 |
| 5,232,817 | 8/1993 | Kawakami et al. | 430/200 |
| 5,238,778 | 8/1993 | Hirai et al. | 430/200 |

FOREIGN PATENT DOCUMENTS

| | | | |
|---|---|---|---|
| 1050805 | 3/1979 | Canada . | |
| 0160396A3 | 6/1985 | European Pat. Off. | B41M 5/26 |
| 2258265 | 1/1975 | France | B41C 1/10 |
| 2264671 | 3/1975 | France | B41N 1/08 |

*Primary Examiner*—Richard L. Schilling

[57] ABSTRACT

A laser-induced melt transfer process is described which utilizes a melt viscosity modifier and in which a post-transfer treatment is used to substantially eliminate back-transfer.

4 Claims, 2 Drawing Sheets

LASER-INDUCED THERMAL TRANSFER PROCESS

FIELD OF THE INVENTION

This invention relates to a thermal transfer process and, in particular to a laser-induced melt transfer process in which there is a post-transfer treatment to substantially eliminate back-transfer.

BACKGROUND OF THE INVENTION

Laser-induced thermal transfer processes are well-known in applications such as color proofing and lithography. The processes use a laserable assemblage comprising a donor element that contains the imageable component, i.e., the material to be transferred, and a receiver element. The donor element is imagewise exposed usually by an infrared laser resulting in transfer of material to the receiver element. The exposure takes place only in a small, selected region of the donor at one time, so that the transfer can be built up one pixel at a time. Computer control produces transfer with high resolution and at high speed.

For the preparation of images for proofing applications, the imageable component is a colorant. For the preparation of lithographic printing plates, the imageable component is an oleophilic material which will receive and transfer ink in printing. In general, these materials do not absorb at the wavelength emitted by the infrared laser. Thus, in most cases a separate infrared radiation absorber is also included.

"Back transfer" can be a problem in the preparation of multicolor images using laser-induced thermal transfer processes. When a second color is applied to the receptor, some of the first color already on the receiver is transferred back to the second donor element. This results in lower color density and poor uniformity. In the preparation of lithographic printing plates using laser-induced thermal transfer processes, the durability of the transferred oleophilic coating can be a problem. The material wears off and does not last for the large number of copies required for lithographic printing runs.

SUMMARY OF THE INVENTION

The process of this invention is directed to laser-induced melt transfer comprising:

a) imagewise exposing to laser radiation a laserable assemblage comprising 1) a donor element comprising a support having at least one layer and bearing on a first surface thereof (i) at least one imageable component, (ii) at least one resin which is capable of undergoing a curing reaction and (iii) and at least one melt viscosity modifier, wherein (i) and (ii) or (ii) and (iii) can be the same or different provided that (i), (ii) and (iii) are not all the same, and further wherein (i), (ii) and (iii) can be in the same or different layers, and 2) a receiver element situated proximally to the first surface of the donor element, wherein a substantial portion of (i), (ii) and (iii) is transferred to the receiver element;

b) separating the donor element from the receiver element; and c) exposing the receiver element of step (b) to a post-transfer treatment to substantially cure the resin transferred thereto.

In another embodiment this invention concerns a laser-induced melt transfer method for making a lithographic printing plate which comprises a) imagewise exposing to laser radiation a laserable assemblage comprising 1) a donor element having at least one layer and bearing on a first surface thereof (i) at least one oleophilic resin, (ii) at least one resin which is capable of undergoing a curing reaction, and (iii) at least one melt viscosity modifier, wherein (i) and (ii) or (ii) and (iii) can be the same or different provided that (i), (ii) and (iii) are not all the same, and further wherein (i), (ii) and (iii) can be in the same or different layers, and 2) a receiver element situated proximally to the surface of the donor element wherein a substantial portion of (i), (ii) and (iii) is transferred to the receiver element; and b) separating the donor element from the receiver element; and c) exposing the receiver element of step (b) to a post-transfer treatment.

In still another embodiment, this invention concerns a laser-induced melt transfer method for making a color image which comprises a) imagewise exposing to laser radiation a laserable imaging assemblage comprising 1) a donor element comprising a support having at least one layer and bearing on a first surface thereof (i) at least one colorant, (ii) at least one resin which is capable of undergoing a curing reaction, and (iii) at least one melt viscosity modifier, wherein (i) and (ii) or (ii) and (iii) can be the same or different provided that (i), (ii) and (iii) are not all the same, and further wherein (i), (ii) and (iii) can be in the same or different layers, and 2) a receiver element situated proximally to the surface of the donor element wherein a substantial portion of (i), (ii) and (iii) is transferred to the receiver element; and b) separating the donor element from the receiver element; and c) exposing the receiver element of step (b) to a post-transfer treatment, steps (a)–(c) being repeated at least once using the same receptor and a different donor element having an imageable component the same as or different from the first imageable component.

DETAILED DESCRIPTION OF THE INVENTION

Figure 1A:
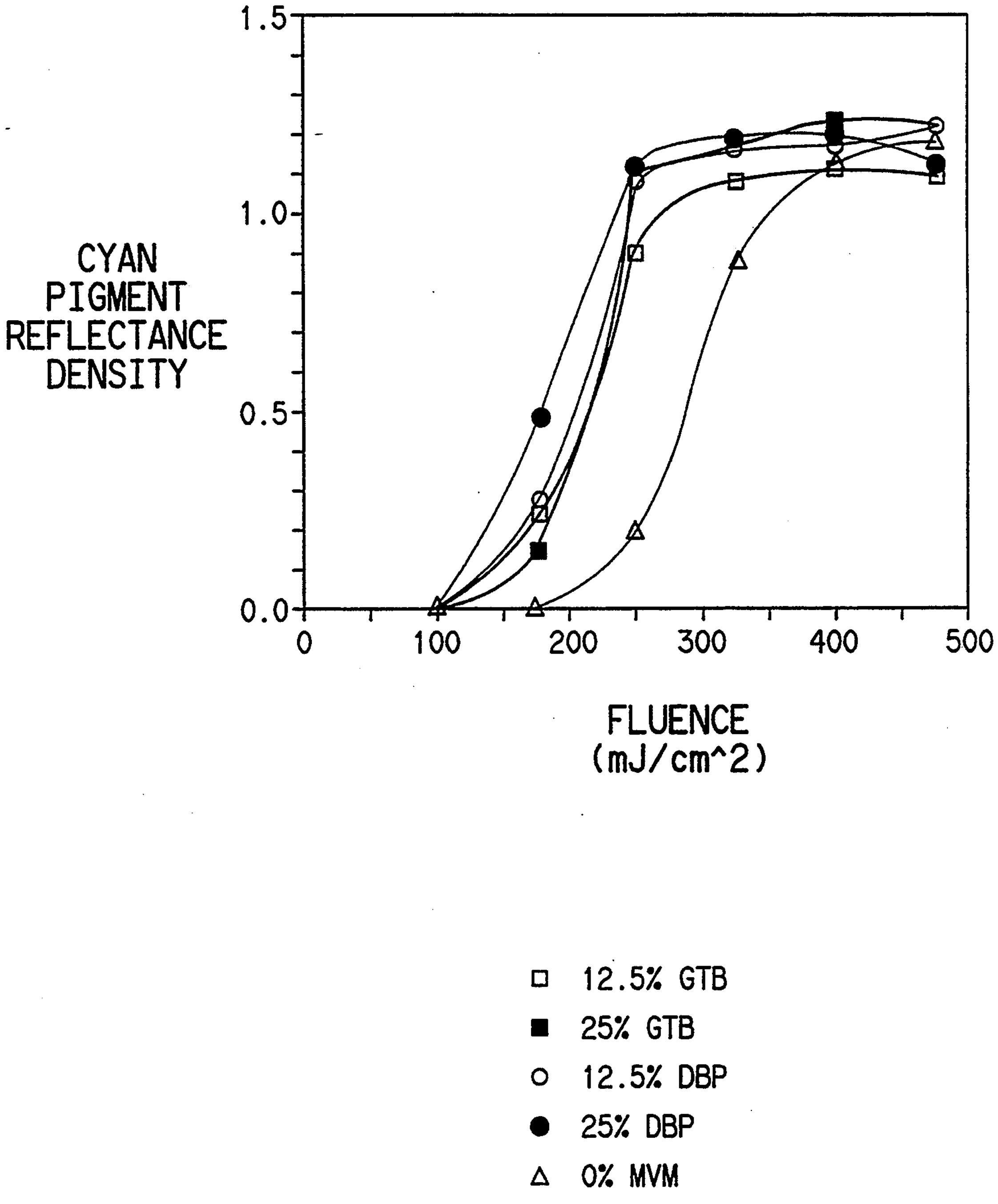
FIG. 1A is a plot of transfer density against laser fluence for low coating weights.

The process of this invention constitutes an improvement in laser-induced thermal transfer. This process includes a post-transfer treatment step to, inter alia, substantially reduce back-transfer for multicolor proofing applications, and provide greater durability for lithographic printing applications.

PROCESS STEPS

1. Exposure

The first step in the process of this invention is imagewise exposing a laserable assemblage to laser radiation. The laserable assemblage comprises 1) a donor element comprising a support having at least one layer and bearing on a first surface thereof (i) at least one imageable component, (ii) at least one resin which is capable of undergoing a curing reaction and (iii) at least one melt viscosity modifier, wherein (i) and (ii) or (ii) and (iii) can be the same or different provided that (i), (ii) and (iii) are not all the same, and further wherein (i), (ii) and (iii) can be in the same or different layers, and 2) a receiver element situated proximally to the first surface of the donor element. The composition of the assemblage is discussed in detail below.

Various types of lasers can be used to expose the laserable assemblage. The laser is preferably one emitting in the infrared, near-infrared or visible region. Particularly advantageous are diode lasers emitting in the region of 750 to 870 nm which offer substantial advantage in terms of their small size, low cost, stability, reliability, ruggedness and ease of modulation. Diode lasers emitting in the range of 800 to 840 nm are most preferred. Such lasers are available from, for example, Spectra Diode Laboratories (San Jose, Calif.).

The exposure can take place through the support of the donor element or through the receiver element, provided that the support or the element is substantially transparent to the laser radiation. In most cases, the donor support will be a film which is transparent to the laser radiation and, thus, exposure can be conveniently carried out through the support. However, if the receiver element is substantially transparent to the laser radiation, the process of the invention can also be carried out by imagewise exposing the receiver element to the laser radiation.

It is preferred that a vacuum be applied to the assemblage during the exposure step. The vacuum provides good contact between the donor and receiver elements, and this facilitates transfer to the receiver element. The vacuum can be conveniently applied as a vacuum drawdown on the bed of the laser imaging apparatus.

The laserable assemblage is exposed imagewise so that material is transferred to the receiver element in a pattern. The pattern itself can be, for example, in the form of dots or linework generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect of each other, such that each minute area of the assemblage ("pixel") is individually addressed by the laser. This is generally accomplished by mounting the laserable assemblage on a rotatable drum. A flatbed recorder can also be used.

2. Separation

The next step in the process of the invention is separating the donor element from the receiver element. Usually this is done by simply peeling the two elements apart. This generally requires very little peel force, and is accomplished by separating the donor support from the receiver element. This can be done using any conventional separation technique and can be manual or automatic (without operator intervention).

3. Post-Transfer Treatment

After separating the donor and receiver elements, the receiver element is subjected to an additional post-transfer treatment to harden or cure the material which has been transferred. This results in a transferred layer which is more durable and much less susceptible to back-transfer. The term "harden or cure" as used herein means a process to increase the toughness and durability of the material transferred to the receiver element.

The post-transfer treatment step can consist of exposure to actinic radiation, heating or a combination thereof. The term "actinic radiation" as used herein means radiation which initiates a hardening or curing reaction in the material transferred. The term "heating" as used herein means raising the temperature of the transferred material to a temperature sufficient to initiate a hardening or curing reaction in the transferred material.

The exact nature of the post-transfer treatment depends on the specific materials to be transferred, and will be discussed in greater detail below.

LASERABLE ASSEMBLAGE

1. Donor Element

The donor element comprises a support having at least one layer and bearing on a first surface thereof (i) at least one imageable component, (ii) at least one resin which is capable of undergoing a curing reaction and (iii) at least one melt viscosity modifier, wherein (i) and (ii) or (ii) and (iii) can be the same or different provided that (i), (ii) and (iii) are not all the same, and further wherein (i), (ii) and (iii) can be in the same or different layers.

Any dimensionally stable, sheet material can be used as the donor support. When the laserable assemblage is to be imaged through the donor support, the support should also be capable of transmitting the laser radiation without being adversely affected by the radiation. There can be mentioned polyesters, such as polyethylene terephthalate and polyethylene naphthanate; polyamides; polycarbonates; fluoropolymers; polyacetals; polyolefins; etc. A preferred support material is polyethylene terephthalate film. The donor support typically has a thickness of about 2 to about 250 micrometers (0.1 to 10 mils). A preferred thickness is about 50 to 175 micrometers (2 to 7 mils). As those skilled in the art will appreciate, some commercially available films will also have subbing layers. These can be used as well.

The nature of the imageable component will depend on the intended application for the assemblage. For imaging applications, the imageable component will be a colorant. Useful colorants include dyes and pigments. Examples of suitable dyes include the Intratherm® dyes available from Crompton and Knowles (Reading, Pa.) and the dyes disclosed by Evans et al. in U.S. Pat. Nos. 5,155,088, 5,134,115, 5,132,276, and 5,081,101, the disclosures of which are hereby incorporated by reference. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Heliogen® Blue L6930; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7). Combinations of pigments and/or dyes can also be used.

In accordance with principles well known to those skilled in the art, the concentration of colorant will be chosen to achieve the optical density desired in the final image. The amount of colorant will depend on the thickness of the active layer and the absorption of the colorant.

A dispersant is usually present when a pigment is to be transferred, in order to achieve maximum color strength, transparency and gloss. The dispersant, generally an organic polymeric compound, is used to disperse the fine pigment particles and avoid flocculation and agglomeration. A wide range of dispersants is commercially available. A dispersant will be selected according to the characteristics of the pigment surface and other components in the composition as practiced by those skilled in the art. Conventional pigment dispersing techniques, such as ball milling, sand milling, etc., can be employed.

The imageable component for lithographic applications is an oleophilic, ink-receptive material. The oleophilic material is usually a film-forming polymeric material. Examples of suitable oleophilic materials include polymers and copolymers of acrylates and methacrylates; polyolefins; polyurethanes; polyaramids; polyesters; epoxy resins; novolak resins; and combinations thereof. Preferred oleophilic materials are acrylic polymers.

A colorant can also be present in lithographic applications. The colorant facilitates inspection of the plate after it is made. Any of the colorants discussed above can be used. The colorant can be in a layer that is the same as or different from the layer containing the oleophilic material.

The donor element further comprises at least one resin capable of undergoing a hardening or curing reaction, as defined above. The term "resin" as used herein encompasses (1) low molecular weight monomers or oligomers capable of undergoing polymerization reactions, (2) polymers or oligomers having pendant reactive groups which are capable of reacting with each other in crosslinking reactions, (3) polymers or oligomers having pendant reactive groups which are capable of reacting with a separate crosslinking agent, and (4) combinations thereof. The resin may or may not require the presence of a curing agent for the curing reaction to occur. A "curing agent" is a compound (or compounds) which must be present for the curing reaction to take place. The term is intended to encompass catalysts, hardening agents, photoinitiators and thermal initiators. The curing agent can undergo a reaction by which it is incorporated into the cured resin product and it can constitute a substantial portion of the cured resin product. The curing agent can also be a true catalyst and remain unchanged at the end of the curing reaction. It will be clear that the ratio of curing agent to curable resin can vary considerably over a very broad range.

Thermosetting resins are preferred. Examples of suitable thermosetting resins which can be used include phenol-formaldehyde resins such as novolacs and resoles; urea-formaldehyde and melamine formaldehyde resins; saturated and unsaturated polyester resins; epoxy resins; urethane resins; and alkyd resins.

Resins which comprise monomers and oligomers which are capable of undergoing acid-catalyzed cationic polymerization (and/or crosslinking) can also be used. Examples of suitable resins include mono- and polyfunctional epoxides, vinyl ethers, and aziridines.

Resins which comprise monomers and oligomers which are capable of undergoing free-radical polymerization (and/or crosslinking) can also be used. Such resins generally contain sites of ethylenic unsaturation. Examples of suitable resins include mono- and polyesters of acrylic and methacrylic acid with alcohols; vinyl and divinyl ethers.

Resins which comprise polymers or oligomers having reactive pendant groups can also be used. Examples of types of reactive groups which can be used, both pendant to the polymer or oligomer and in a separate crosslinking agent, include amino and acid or acid anhydride groups which react to form amide linkages; alcohol and acid or acid anhydride groups which react to form ester linkages; isocyanate and alcohol groups which react to form urethane linkages; dianhydride and amino groups which react to form an imide linkage; acid and epoxy or aziridine groups; etc.

Epoxy-containing acrylate or methacrylate polymers are of interest for lithographic printing plate applications. These can be made, for example, through copolymerization of acrylate and/or methacrylate monomers with glycidyl acrylate or methacrylate. Suitable synthetic techniques are well known to those skilled in the art. The epoxy-(meth)acrylate polymers are generally used in conjunction with di- or multi-functional crosslinkers such as epoxides and divinyl ethers.

In some cases, particularly for lithographic applications, the imageable component and the curable resin are the same. That is, the curable resin may possess the necessary oleophilic properties for the lithographic printing plate and, thus, it is not necessary to transfer additional oleophilic material. Such systems are also contemplated as a part of the present invention.

The donor element further comprises at least one melt viscosity modifier (MVM). Surprisingly, it has been found that the addition of an MVM to the donor element dramatically improves the transfer process. For a given coating weight, the addition of an MVM results in a lowering of the laser fluence necessary to produce a given transfer density. Laser fluence is defined herein as energy per unit area at full width half max of a gaussian beam.

Figure 1B:
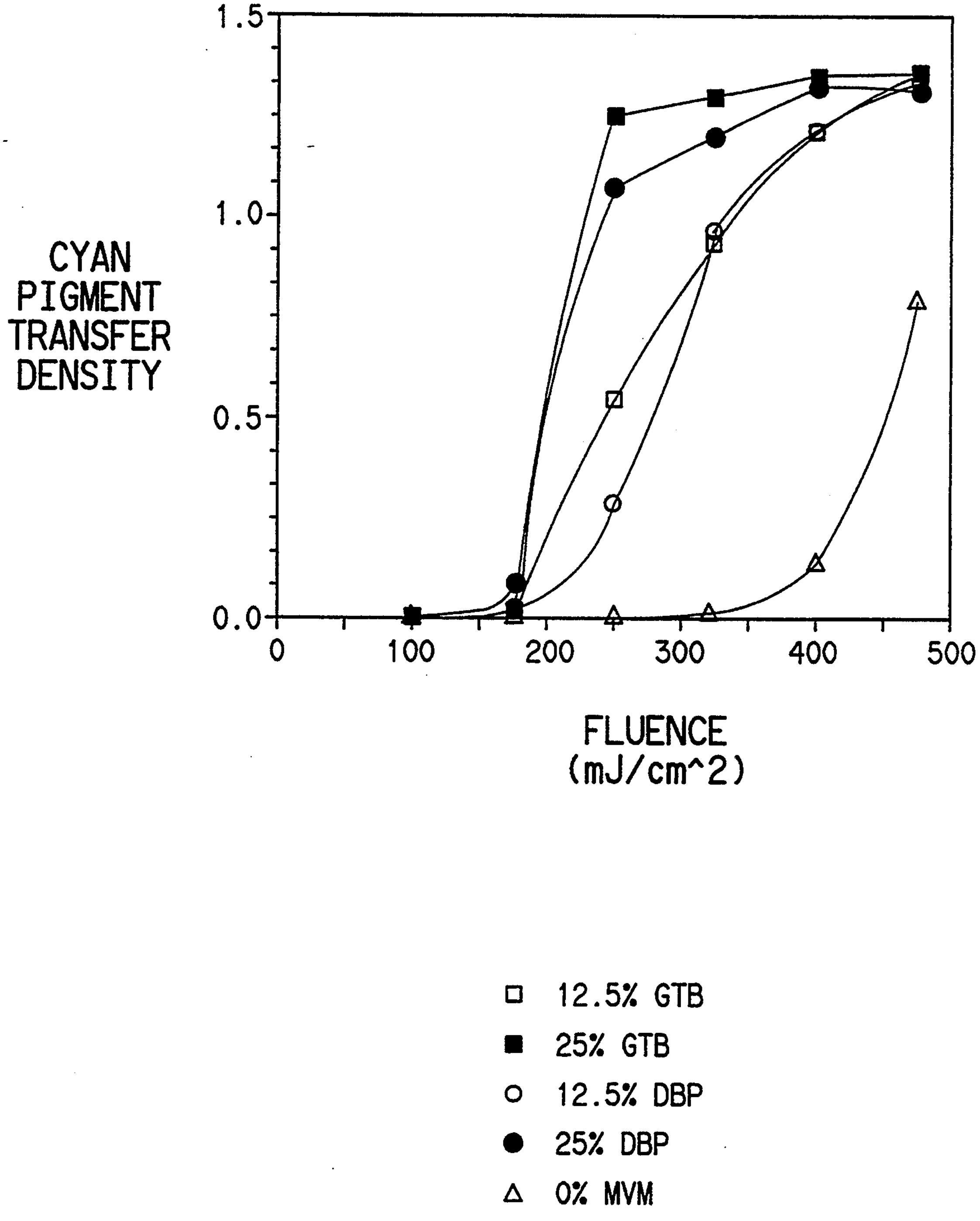
FIG. 1B is a plot of transfer density against laser fluence for high coating weights.

The beneficial effect of the MVM is clearly illustrated by FIG. 1. This figure contains a family of curves in which transferred density is plotted against the laser fluence used for different amounts of MVM at low (FIG. 1A) and high (FIG.1B) coating weights. Although the curves end at approximately the same transferred density, The addition of the MVM shifts the curve to lower fluences, meaning that lower laser power is necessary in order to transfer the imageable component. For the higher coating weight, the material without MVM does not achieve the pigment transfer density of the MVM materials, even at the highest fluence level.

While not wishing to be bound by any theory, it is believed that the addition of the MVM may alter the mechanism by which the imageable component is transferred to the receiver element. The addition of the MVM, allows the imageable component to be transferred by what is believed to be a melt transfer mechanism. The MVM lowers the softening point and the melt viscosity of the materials on the donor support, thus facilitating a melt transfer.

The MVM should be compatible with the other materials on the donor element and lower their softening point. Types of materials which can be used as the MVM include plasticizers, monomers and low molecular weight oligomers. Plasticizers are well known and numerous examples can be found in the art. These include, for example, acetate esters of glycerine; polyesters of phthalic, adipic and benzoic acids; ethoxylated alcohols and phenols; mono- and divinyl ethers; and the like. The monomers and low molecular weight oligomers described above can also be used as the MVM. Mixtures can also be used. In some cases, the resin and the MVM will be the same. Dibutyl phthalate and glyceryl tribenzoate are preferred as the MVM.

When more than one material is to be transferred, these materials can be in a single layer on the support, or in different layers on the same side of the support. The concentration of the various materials on the support will be stated relative to the weight of all the layers on the support, i.e., the total coating weight. Depending upon the desired optical density, typical colorant concentrations are 5 to 75% by weight, based on the total coating weight preferably 20–40%. For optimum particle size, a dispersant is generally present in a 1:1 to 1:3 dispersant to pigment ratio. The amount of oleophilic material is generally about 20–60% by weight, based on the total coating weight preferably 30 to 50% by weight. The curable resin is generally present in an amount of about 10 to 50% by weight, based on the total coating weight. The MVM is generally present in an amount of about 5 to 35% by weight, based on the total coating weight.

It will be apparent from the above discussion, that one component can have more than one function. The oleophilic material can also be the curable resin. The concentration of this material can then exceed 60% by weight, based on the total coating weight, and can be as high as 90% by weight. The curable resin can also be the MVM. The concentration of this material can then exceed 50% by weight, based on the total coating weight, and can be as high as 90% by weight. However, a single material cannot function as oleophilic material, curable resin and the MVM.

To facilitate the curing reaction, the donor element can further comprise a curing agent, as defined above. Suitable hardening agents and catalysts which function as curing agents for epoxy-based and novolac resins are well known in the art. Examples of hardening agents and catalysts include reactive low molecular weight polyfunctional epoxides and aziridines; Lewis acids; phenols; organic acids; acid anhydrides; Lewis bases; inorganic bases; amides; and primary, secondary and tertiary amines. A complete discussion can be found in, e.g., *Handbook of Epoxy Resins*, by H. Lee and K. Neville (McGraw Hill, 1982).

The curing agent can also be an initiator. The initiator is a compound or system of compounds which, under initiating conditions, forms a species which is capable of initiating the hardening reaction for the resin. The initiator is generally either a photoinitiator, i.e., a material which is sensitive to actinic radiation, or a thermal initiator. By actinic radiation, it is meant high energy radiation including, but not limited to, UV, visible, electron beam and X-ray radiation.

Photoinitiators suitable for initiating cationic crosslinking or polymerization reactions are those which, upon irradiation, produce a Lewis acid or a protonic Bronsted acid which is capable of initiating the polymerization of vinyl ethers, ethylene oxide or epoxy derivatives. Most photoinitators of this type are onium salts, such as diazonium, iodonium, sulfonium and phosphonium salts.

Suitable photoinitiators for free radical reactions include peroxides, such as benzoyl peroxide; azo compounds, such as 2,2'-azobis(butyronitrile) (AIBN); benzoin derivatives, such as benzoin and benzoin methyl ether; derivatives of acetophenone, such as 2,2-dimethoxy-2-phenylacetophenone; ketoxime esters of benzoin; triazines; biimdazoles; anthraquinone and a hydrogen donor; benzophenone and tertiary amines; Michler's ketone alone and with benzophenone; thioxanthones; and 3-ketocoumarins.

Sensitizing agents can also be included with the photoinitiators discussed above. In general, sensitizing agents are those materials which absorb radiation at a wavelength different than that of the reaction-initiating component, and are capable of transferring the absorbed energy to that component. Thus, the wavelength of the activating radiation can be adjusted.

A thermal initiator generally includes an organic peroxide or hydroperoxide, such as benzoyl peroxide or a material such as AIBN. It will be appreciated by those skilled in the art, that many of resins will undergo hardening reactions when heated even in the absence of a separate thermal initiator. In such cases, the reactive groups of the resin function as the thermal initiator. Such systems are included within the scope of the invention.

When the curing agent is a catalyst or initiator, it is generally present in an amount of about 0.05 to 10% by weight, based on the total coating weight, preferably 0.5 to 5% by weight. When the curing agent is a hardening agent, it can be present in substantially greater amounts. It will be appreciated that the hardening agent can also function as the MVM.

It is desirable in most cases to include a laser radiation absorbing component in the donor element. For use with IR, near-IR, or visible lasers, the laser radiation absorbing component can comprise finely divided particles of metals such as aluminum, copper or zinc, or one of the dark inorganic pigments, such as carbon black or graphite. However, for color image formation, the component is preferably an infrared or near-IR absorbing dye. Suitable dyes which can be used alone or in combination include poly(substituted)phthalocyanine compounds and metal-containing phthalocyanine compounds; cyanine dyes; squarylium dyes; chalcogenopyryloarylidene dyes; croconium dyes; metal thiolate dyes; bis(chalcogenopyrylo)polymethine dyes; oxyindolizine dyes; bis(aminoaryl)polymethine dyes; merocyanine dyes; and quinoid dyes. Infrared-absorbing materials for laser-induced thermal imaging have been disclosed, for example, by: Barlow, U.S. Pat. No. 4,778,128; DeBoer, U.S. Pat. Nos. 4,942,141, 4,948,778, and 4,950,639; Kellogg, U.S. Pat. No. 5,019,549; Evans, U.S. Pat. Nos. 4,948,776 and 4,948,777; and Chapman, U.S. Pat. No. 4,952,552, the disclosures of which are hereby incorporated by reference.

The laser radiation absorbing component can be in the same layer as either the imageable component, or the curable resin, or in a separate layer. When present, the component generally has a concentration of about 1 to 10% by weight, based on the total coating weight.

Other ingredients, for example, surfactants, coating aids and binders, can be present in any of the layers on the support, provided that they: (i) are compatible with the other ingredients, (ii) do not adversely affect the properties of the assemblage in the practice of the process of the invention, and, (iii) for color imaging applications, do not impart unwanted color to the image.

A polymeric binder can be used in addition to the curable resin and imageable component. The binder should be of sufficiently high molecular weight that it is film forming, yet of sufficiently low molecular weight that it is soluble in the coating solvent. A surfactant can be added to improve the wetting and flow characteristics of the composition.

The compositions for the layer or layers to be coated onto the donor support can each be applied as a dispersion in a suitable solvent, however, it is preferred to coat them from a solution. Any suitable solvent can be used as a coating solvent, as long as it does not deleteriously affect the properties of the assemblage, using conventional coating techniques or printing techniques, for example, gravure printing.

2. Receiver Element

The receiver element typically comprises a receptor support and, optionally, an image-receiving layer. The receptor support comprises a dimensionally stable sheet material. As noted above, the assemblage can be imaged through the receptor support if that support is transparent. Examples of transparent films suitable as a receptor support include, for example polyethylene terephthalate, polyether sulfone, a polyimide, a poly(vinyl alcohol-co-acetal), or a cellulose ester, such as cellulose acetate. Examples of opaque supports materials include, for example, polyethylene terephthalate filled with a white pigment such as titanium dioxide, various paper substrates, or synthetic paper, such as Tyvek® spunbonded polyolefin. For lithographic printing applications, the support is typically a thin sheet of aluminum, e.g. anodized aluminum, or polyester.

Although the imageable component can be transferred directly to the receptor support, the receiver element typically has an additional receiving layer on one surface thereof. For image formation applications, the receiving layer can be a coating of, for example, a polycarbonate, a polyurethane, a polyester, polvinyl chloride, styrene/acrylonitrile copolymer, poly(caprolactone), and mixtures thereof. This image receiving layer can be present in any amount effective to achieve the intended purpose. In general, good results have been obtained at coating weights of 1 to 5 g/m$^2$. For lithographic applications, typically the aluminum sheet is treated to form a layer of anodized aluminum on the surface as a receptor layer. Such treatments are well known in the lithographic art.

It is also possible that the receiver element not be the final intended support for the imageable component. The receiver element can be an intermediate element and the laser imaging step can be followed by one or more transfer steps by which the imageable component is transferred to the final support. This is most likely to be the case for multicolor proofing applications in which the multicolor image is built up on the receiver element and then transferred to the permanent paper support. The post-transfer treatment step generally takes place after transfer to the permanent support, but can take place when the imageable component is on the receiver element.

The following examples illustrate practice of the invention and should not be construed as limitation thereon.

EXAMPLES

| GLOSSARY: | |
|---|---|
| BGE | butyl glycidyl ether |
| CHVE | 1,4-bis[vinyloxy)methyl]cyclohexane |
| CY 179 | cycloaliphatic liquid expoxy resin; Araldite ® CY 179; from Ciba-Geigy |
| Cyan | Heliogen ® blue pigment L6930; added as a 20/10/70 dispersion of pigment/RCH-87763 dispersant/solvent (MEK or NBA) |
| DBP | dibutyl phthalate |
| DEH 82 | epoxy during agent: 65–69% bisphenol A epoxy resin; 24–29% bisphenol A; 3.5% 2-methylimidazole; 2.5% polyacrylate flow modifier; from Dow Chemical Co., Midland, MI |
| DER 6225 | medium molecular weight bisphenol A-based epoxy resin, melt viscosity (150° C.) 800–1600 cs; from Dow Chemical Co., Midland, MI |
| DER 642U | high molecular weight novolac-modified epoxy resin, melt viscosity (150° C.) 2000–4000 cs; from Dow Chemical Co., Midland, MI |
| DER 661 | low molecular weight bisphenol A-based epoxy; melt viscosity (150°C.) 400–800 cs; from Dow Chemical Co., Midland, MI |
| DER 665U | high molecular weight bisphenol A-based epoxy resin, melt viscosity (150° C.) 10,000–30,000 cs; from Dow Chemical Co., Midland, MI |
| DER 668 | high molecular weight bisphenol A-based epoxy resin, Gardner viscosity at 40% non-volatile in Dowanol ® DB glycol ether Z-Z4; from Dow Chemical Co., Midland, MI |
| DVE | triethylene glycol divinyl ether |
| E2010 | medium molecular weight methacrylate polymer; Elvacite ® 2010 from E. I. du Pont de Nemours & Co., Wilmington, DE |
| EB 3605 | Ebecryl ® 3605 is a partially acrylated bisphenol A epoxy resin sold by Radcure, 9800 E. Bluegrass Parkway, Louisville, Kentucky 40299 |
| EPT2445 | low molecular weight polymethylmethacrylate, MW about 10,000 |
| EPT2519 | methacrylae terpolymer with 16 wt % glycidyl methacrylate |
| EPT2678 | methacrylate terpolymer with 7.5 wt % glycidyl methacrylate |
| GTB | glyceryl tribenzoate; Uniplex ® 260 from Unitex Chemical Corp. |
| HBVE | 4-(ethenyloxy)-1-butanol |
| MEK | methylethyl ketone |
| NBA | n-butyl acetate |
| PMMA | methyl methacrylate polymer |
| RCH 87763 | AB dispersant |
| SQS | near-IR dye; 4-[3-[2,6-Bis (1,10-dimethylethyl)-4H-thiopyran-4-ylidene]methyl]-2-hydroxy-4-oxo-2-cyclobuten-1-ylidene]methyl-2, 6-bis, (1,1-dithylethyl) thiopyrulium hydroxide, inner salt |
| T-785 | solid epoxy-novolac resin; TACTIX 785 from Dow Chemical Co., Midland, MI |
| TIC-5C | near-IR dye; 3H-Indolium, 2-[2-[2-chloro-3-[2-(1,3-dihydro-2H-indol-2-ylidene)ethylidene]-1-cyclopenten-1-yl]-ethenyl]-1,3,3-trimethyl-trifluoromethanesulfonate |

In the examples which follow, "coating solution" refers to the mixture of solvent and additives which is coated on the support. Amounts are expressed in parts by weight, unless otherwise specified.

General Procedure

The components of the coating solution were combined in an amber glass bottle and rolled overnight to ensure complete mixing. When a pigment was present in the composition, it was first mixed with the dispersant in a solvent on an attritor with steel balls for approximately 20 hours. The mixed solution was then coated onto a 4 mil (0.010 cm) thick sheet of Mylar® polyester film (E. I. du Pont de Nemours and Company, Wilmington, Del.). The coating was air dried to form a donor element having a laserable layer having a dry thickness of in the range from 0.3 to 2.0 micrometers depending on percent solids of the formulation and the blade used to coat the formulation onto the plate.

The receiver element was placed on the drum of a laser imaging apparatus such that the receiving layer, if present, is facing outward (away from the drum surface). The donor element was then placed on top of the receiver element such that the infrared sensitive layer was adjacent to the receiving side of the receiver element. A vacuum was then applied. The first imaging apparatus was a Crosfield magnascan 646M (Crosfield Electronics, Ltd., London, England) which had been retrofitted with a CREO writehead (Creo Corp., Vancouver, BC) using an array of 36 infrared lasers emitting at 830 nm (SDL-7032-102 from Sanyo Semiconductor, Allendale, N.J.). The second laser imaging apparatus was a Creo Plotter (Creo Corp., Vancouver, BC) with 32 infrared laser emitting at 830 nm. The laser fluence was calculated based on laser power and drum speed.

TABLE 1

CALCULATED LASER FLUENCE vs. DRUM SPEED

| Drum speed/fluence correlation | | | |
|---|---|---|---|
| Pitch (um) | r (1/e²) (um) | Fluence (FWHM) (mJ/cm²) | Drum Velocity (rpm) |
| 2.9 | 3.9 | 100 | 370 |
| | | 150 | 246 |
| | | 200 | 185 |
| | | 250 | 148 |
| | | 300 | 123 |
| | | 350 | 106 |

When the vacuum was removed the donor element separated from the receiver element.

The post-transfer treatment steps are discussed with each example.

EXAMPLE 1

This example illustrates the effect of the MVM on the curable resin. The resin used was EPT2678. One MVM (HBVE) was capable of reaction with the resin. The other MVM (DBP) was not capable of reacting with the resin.

The components were mixed together at three different MVM:resin ratios. The Brookfield viscosity was measured on a Brookfield Viscometer, model DV-II, at 25° C. The results are given below. The resin without an MVM was a solid and thus the Brookfield viscosity was not necessary.

| | Brookfield Viscosity | |
|---|---|---|
| MVM:Resin | HBVE (Spindle #, Speed) | DBP (Spindle #, Speed) |
| 1:1 | 5740 (2, 3) | 782,000 (4, 0.3) |
| 2:1 | 210 (2, 12) | 4,210 (3, 3) |
| 3:1 | 63 (2, 12) | 521 (3, 3) |

-continued

It is clear that both types of MVM lower the viscosity of the resin. In this case, HBVE is more effective at lowering the viscosity.

EXAMPLE 2

This example illustrates the effect of the MVM on transfer density.

Cyan pigment was the imageable component; EPT2678 was the curable resin; DBP or GTB was the MVM. The receiver element was paper. The Creo Plotter was used for imaging.

Coating formulations were prepared as 10 wt % solids in MEK, having the following compositions:

| | Weight % (Dry Coating Basis) | | | | |
|---|---|---|---|---|---|
| Component | Control | 2A | 2B | 2C | 2D |
| Cyan | 45 | 45 | 45 | 45 | 45 |
| DBP | 0 | 12.5 | 25 | 0 | 0 |
| GTB | 0 | 0 | 0 | 12.5 | 25 |
| EPT2678 | 50 | 37.5 | 25 | 37.5 | 25 |
| SQS | 5 | 5.0 | 5.0 | 5.0 | 5.0 |

These formulations were first coated onto Mylar® using a 1.5 $\mu$m blade to obtain a low coating weight coating. A second coating was made for each formulation using a 3.0 $\mu$m blade to obtain a high coating weight.

The coated samples were imaged using different laser fluences and the reflectance density of the image transferred to paper was measured as null density using the reflectance mode of a MacBeth densitometer. The results for the low coating weight samples are given in Table 1 below and in FIG. 1A. The results for the high coating weight samples are given in Table 2 below and in FIG. 1B.

The post-treatment step was omitted in this example; as it was not necessary to measure transferred density.

TABLE 1

Low Coating Weights

| Fluence | Density Transferred | | | | |
|---|---|---|---|---|---|
| (mJ/cm²) | Control | 2A | 2B | 2C | 2D |
| 100 | 0.00 | 0.00 | 0.00 | 0.00 | 0.00 |
| 175 | 0.00 | 0.28 | 0.48 | 0.24 | 0.14 |
| 250 | 0.19 | 1.08 | 1.12 | 0.90 | 1.08 |
| 325 | 0.89 | 1.18 | 1.20 | 1.09 | 1.18 |
| 400 | 1.14 | 1.19 | 1.21 | 1.14 | 1.24 |
| 475 | 1.19 | 1.23 | 1.13 | 1.11 | 1.22 |

TABLE 2

High Coating Weights

| Fluence | Density Transferred | | | | |
|---|---|---|---|---|---|
| (mJ/cm²) | Control | 2A | 2B | 2C | 2D |
| 100 | 0.00 | 0.00 | 0.00 | 0.00 | 0.00 |
| 175 | 0.00 | 0.00 | 0.03 | 0.00 | 0.08 |
| 250 | 0.00 | 0.29 | 1.06 | 0.53 | 1.24 |
| 325 | 0.01 | 0.96 | 1.18 | 0.93 | 1.29 |
| 400 | 0.15 | 1.20 | 1.30 | 1.20 | 1.34 |
| 475 | 0.77 | 1.32 | 1.29 | 1.34 | 1.34 |

It is clear from the tables and graphs that transferred pigment density is greater when the MVM is present except at the highest fluence levels. In the absence of the MVM, transferred pigment density actually decreases as the coating weight is increased.

EXAMPLE 3

This example illustrates the effect of the MVM in a lithographic application. It also illustrates the improved durability of the transferred oleophilic material after the post-transfer treatment.

DER 665U functioned as olephilic material and curable resin; DVE and CHVE were the MVM; DEH 82 contained curing agent. The receiver element was a sheet of anodized aluminum (Imperial type DE from Imperial Metal and Chemical Co., Philadephia, Pa.). The Crosfield apparatus was used for imaging with a fluence level of about 800 mJ/cm$^2$.

Coating formulations were prepared as 15 wt % solids in MEK, having the following compositions:

| | Weight % (Dry Coating Basis) | |
|---|---|---|
| Component | Control | Sample 3 |
| DEH 82 | 3.5 | 3.5 |
| DVE | 0 | 23.5 |
| CHVE | 0 | 23.5 |
| TIC-5C | 3.5 | 3.5 |
| DER 665U | 93.0 | 46.0 |

With the control, little or no transfer to the surface of the aluminum plate was observed. Good transfer was observed with Sample 3, visible as a greenish image, so colored by the presence of the near-IR dye, TIC-5C. The thickness of the image on the aluminum receiver element was measured using a DEKTAK profilometer and found to be approximately 1.5 to 2.0 micrometers.

The durability of the transferred material was tested by wiping with MEK. The transferred material was easily wiped off without any post-transfer treatment. When the transferred material was subjected to a post-transfer treatment of heating at 240° C. for two minutes, the transferred material could not be wiped off.

EXAMPLE 4

This example illustrates the ability to use lower levels of the laser-absorbing component when an MVM is present. To demonstrate this, a post-transfer treatment step was not needed.

A pigment was the imageable component; E2010 was a binder; EPT2445 was the curable resin; GTB was the MVM. The receiver element was paper. The Creo Plotter was used for imaging.

Coating formulations were prepared as 10 wt % solids in MEK, having the following compositions:

| | Component | | | | |
|---|---|---|---|---|---|
| Sample | Cyan | E2010 | EPT2445 | GTB | SQS |
| | Controls (No MVM) | | | | |
| C4-A | 75 | 15.9 | 0 | 0 | 9.1 |
| C4-B | 78.6 | 16.7 | 0 | 0 | 4.8 |
| C4-C | 79.5 | 16.9 | 0 | 0 | 3.6 |
| C4-D | 80.5 | 17.1 | 0 | 0 | 2.4 |
| C4-E | 81.5 | 17.3 | 0 | 0 | 1.2 |
| C4-F | 82.5 | 17.5 | 0 | 0 | 0 |
| | With MVM | | | | |
| 4-A | 27.3 | 0 | 22.7 | 40.9 | 9.1 |
| 4-B | 28.6 | 0 | 23.8 | 42.9 | 4.8 |
| 4-C | 28.9 | 0 | 24.1 | 43.4 | 3.6 |

-continued

| | Component | | | | |
|---|---|---|---|---|---|
| Sample | Cyan | E2010 | EPT2445 | GTB | SQS |
| 4-D | 29.3 | 0 | 24.4 | 43.9 | 2.4 |
| 4-E | 29.6 | 0 | 24.7 | 44.4 | 1.2 |
| 4-F | 30 | 0 | 25 | 45 | 0 |

The samples were imaged at three different fluence levels. The density transferred was measured as described above. The results are given in Table 3.

TABLE 3

| | Density Transferred | | |
|---|---|---|---|
| Sample | 308 | 231 | 184 mJ/cm$^2$ |
| | No MVM | | |
| C4-A | 0.84 | 0.64 | 0.34 |
| C4-B | 0.57 | 0.40 | 0.17 |
| C4-C | 0.53 | 0.28 | 0.15 |
| C4-D | 0.30 | 0.13 | 0.04 |
| C4-E | 0.03 | 0.00 | 0.00 |
| C4-F | 0.00 | 0.00 | 0.00 |
| | With MVM | | |
| 4-A | 0.83 | 0.97 | 0.85 |
| 4-B | 0.90 | 0.93 | 0.75 |
| 4-C | 0.85 | 0.985 | 0.68 |
| 4-D | 0.86 | 0.80 | 0.35 |
| 4-E | 0.72 | 0.33 | 0.11 |
| 4-F | 0.00 | 0.00 | 0.00 |

From these results it can be seen that (1) the melt process of the invention in which the MVM is present is much less sensitive to energy (laser fluence); (2) the melt process of the invention in which the MVM is present needs less laser absorbing component; and (3) the pigment loading to achieve equivalent densities is much lower when the MVM is present. This results in greater formulation latitude which can be important in achieving SWOP densities. It also allows for the use of lower concentrations of laser absorbing components which can add unwanted color in proofing applications.

EXAMPLE 5

This example illustrates the preparation of a multicolor proof with low back transfer using the process of the invention.

Coating solutions were prepared in MEK solvent with 10% solids having the following composition:

| Component | Wt. %[a] |
|---|---|
| carbon black | 40 |
| RCH-87763 | 20 |
| EPT2519 | 23.5 |
| CY 179 | 15 |
| FX-512 | 1.5 |

[a]solids basis

Carbon black was the imageable component and also functioned as a laser radiation absorbing component; EPT2519 was the curable resin; CY179 was the MVM.

After coating and imaging, using a paper receiving element, the imaged paper was then given a post-transfer treatment:exposed to a Douthitt UV light source for 150 seconds and placed in an air circulating oven for five minutes at 100° C.

A coating solution was prepared, also as a 10% solids solution in MEK, with the following composition:

| Component | Wt. %[a] |
|---|---|
| PMMA | 26.2 |
| GTB | 50.5 |
| SQS | 5.6 |
| Cyan | 17.7 |

[a]solids basis

Cyan pigment was the imageable component; GTB was the MVM; MMA was a binder. No curable resin was included in this formulation because it was used as the top layer. It had no layer coated on it to which it could back transfer.

This was coated and laser exposed as described in the general procedure using the imaged receiving element from the first step as the receiving element. Analysis showed very little to none of the black back transferred to the under side of the cyan coated Mylar® film.

EXAMPLE 6

This example illustrates several different formulations for lithographic printing plate applications. It also shows the ability of the plates prepared from these formulations to accept ink.

DER 665U, EB 3605 and EPT 2519 functioned as oleophilic material and curable resin; DVE and CHVE were the MVM; DEH 82 and FX-512 contained curing agents. The receiver element was a sheet of anodized aluminum, Imperial type DE (Imperial Metal and Chemical Co., Philadelphia, Pa.).

Samples were prepared, laser imaged and given a post-transfer treatment as in Example 3.

Coating formulations were prepared at 11 wt % solids in MEK, having the following compositions:

| | Weight % (Dry Coating Basis) | | | | |
|---|---|---|---|---|---|
| Component | 6A | 6B | 6C | 6D | 6E |
| DEH 82 | 4.7 | 4.7 | — | 4.7 | 4.7 |
| FX-512 | — | — | 4.7 | — | — |
| DVE | 22.9 | 22.9 | 22.9 | 22.9 | 22.9 |
| CHVE | 22.9 | 22.9 | 22.9 | 22.9 | 22.9 |
| TIC-5C | 4.7 | 4.7 | 4.7 | 4.7 | 4.7 |
| DER 665U | 45.5 | — | 45.5 | — | — |
| EB 3605 | — | 45.5 | — | — | — |
| EPT 2519 | — | — | — | 45.5 | — |
| T-785 | — | — | — | — | 45.5 |

The resulting cured plates were used to print black ink onto paper. The black reflectance densities were measured on the inked plates. The results are given below:

| Sample | Reflectance Density |
|---|---|
| 6A | 1.20 |
| 6B | 0.42 |

-continued

| Sample | Reflectance Density |
|---|---|
| 6C | 1.00 |
| 6D | 1.22 |

The results show that samples 6A and 6D perform the best.

What is claimed is:

1. A laser-induced melt transfer method for making a color image which comprises:
   a) imagewise exposing to laser radiation a laserable assemblage consisting essentially of:
      1) a donor element consisting essentially of a support bearing on a first surface thereof a composition selected from the group consisting of:
         (A) (i) at least one colorant, (ii) at least one resin which is capable of undergoing a curing reaction, and (iii) at least one melt viscosity modifier to lower melt viscosity,
         (B) (i) at least one imageable component, (ii) at least one resin which is capable of undergoing a curing reaction, (iii) at least one melt viscosity modifier to lower melt viscosity, and (iv) a binder,
         (C) (i) at least one imageable component, (ii) at least one resin which is capable of undergoing a curing reaction, (iii) at least one melt viscosity modifier to lower melt viscosity, and (iv) a laser radiation absorbing component, and
         (D) (i) at least one imageable component, (ii) at least one resin which is capable of undergoing a curing reaction, (iii) at least one melt viscosity modifier to lower melt viscosity, (iv) a binder, and (v) a laser radiation absorbing component,
         wherein (ii) and (iii) can be the same or different, and
         wherein (i), (ii) and (iii) can be in the same or different layers, and
      2) a receiver element situated proximally to the first surface of the donor element, wherein a substantial portion of (i), (ii) and (iii) is transferred to the receiver element;
   b) separating the donor element from the receiver element; and
   c) exposing the receiver element of step (b) to a post-transfer curing treatment,
   steps (a)-(c) being repeated at least once using the same receptor and a different donor element having a colorant the same as or different from the first colorant.

2. A process according to claim 1 wherein the receiver element is paper.

3. A process according to claim 1 wherein the laser radiation is in the near IR or visible region.

4. A process according to claim 1 wherein the melt viscosity modifier is selected from the group consisting of dibutyl phthalate and glyceryl tribenzoate.

* * * * *